US010630310B1

(12) United States Patent
Litjes et al.

(10) Patent No.: US 10,630,310 B1
(45) Date of Patent: Apr. 21, 2020

(54) ANALOG SIGNAL GENERATION BY HARDWARE RE-USE IN SAMPLED CIRCUITS

(71) Applicant: NXP B.V., San Jose, CA (US)

(72) Inventors: Alphons Litjes, Zijtaart (NL); Erik Olieman, Waalre (NL); Ibrahim Candan, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/523,285

(22) Filed: Jul. 26, 2019

(51) Int. Cl.
*H03M 1/00* (2006.01)
*H03M 1/46* (2006.01)
*H03M 1/12* (2006.01)

(52) U.S. Cl.
CPC ......... *H03M 1/468* (2013.01); *H03M 1/1245* (2013.01); *H03M 1/462* (2013.01)

(58) Field of Classification Search
CPC ..... H03M 1/468; H03M 1/1245; H03M 1/462
USPC ......................................... 341/144, 155, 122
See application file for complete search history.

(56) References Cited

U.S. PATENT DOCUMENTS

| 6,825,785 | B1* | 11/2004 | Huang | H03L 7/093 341/141 |
| 7,576,678 | B2* | 8/2009 | Chatal | H03M 1/462 341/155 |
| 7,733,258 | B2* | 6/2010 | Berens | H03M 1/007 341/145 |
| 7,796,079 | B2 | 9/2010 | Khanna et al. | |
| 8,248,283 | B2* | 8/2012 | Mandal | H03M 1/06 341/141 |
| 8,477,052 | B2 | 7/2013 | Dey et al. | |
| 8,487,805 | B1 | 7/2013 | Gupta et al. | |
| 8,766,833 | B1* | 7/2014 | Bogner | H03M 1/1014 341/120 |
| 8,933,830 | B1 | 1/2015 | Jeon | |
| 9,882,575 | B1 | 1/2018 | Li et al. | |

(Continued)

FOREIGN PATENT DOCUMENTS

| CN | 107453758 | 12/2017 |
| CN | 107959498 | 4/2018 |
| CN | 107959798 | 4/2018 |

OTHER PUBLICATIONS

Xizhu Peng et al., "A Novel Comparator Offset Calibration Technique for SAR ADCs", IEEE International Conference on Electron Devices and Solid State Circuits (EDSSC) 2018.

*Primary Examiner* — Jean B Jeanglaude

(57) ABSTRACT

An integrated charge redistribution successive approximate register (CR-SAR) analog-to-digital converter (ADC) includes a sample-and-hold switch, a digital-to-analog converter (DAC), a comparator and a logic circuit. The sample-and-hold switch obtains a sample input voltage (Vin). The DAC includes a plurality of digital multiplexers that selects between a superposition phase, which superimposes an analog offset voltage onto Vin, and a conversion phase which determines values for a digital output register which determines the input values to each control line. Each digital multiplexer presents input values to a control line. The comparator has two inputs coupled to the sample-and-hold switch and to the DAC such that the output of the converter determines a value of each successive bit in the digital output register. The logic circuit is coupled to the comparator and to digital multiplexers and includes the digital output register.

20 Claims, 15 Drawing Sheets

1300

(56) References Cited

U.S. PATENT DOCUMENTS

| | | |
|---|---|---|
| 9,893,739 B2 | 2/2018 | Bode |
| 10,079,610 B2 * | 9/2018 | Bogner ................ H03M 1/109 |

\* cited by examiner

US 10,630,310 B1

ANALOG SIGNAL GENERATION BY HARDWARE RE-USE IN SAMPLED CIRCUITS

BACKGROUND

Field

This invention relates generally to active solid-state devices, and more specifically to an analog electronic circuit that uses a sampling digital-to-analog converter (DAC).

Related Art

Analog circuits that process sampled signals may suffer from linear and non-linear errors. These errors often need to be reduced or circumvented. Error reduction can be done in the analog domain by additional compensation circuits. When possible, error reduction can also be performed in the digital domain when the sampled signal is quantized, such as in an analog-to-digital converter (ADC). Analog compensation circuits are typically a trade-off between compensation resolution, power and area. Digital compensation is usually limited by a resolution of the ADC. Analog compensation has a higher resolution but requires adding circuitry to analog sensitive nodes which results in design complexity/concessions.

An example of a known single-ended, charge redistribution, successive approximate register (CR-SAR) ADC 100 is shown in FIG. 1. A single-ended ADC is an ADC that has only one input. A sample-and-hold switch 102 allows an input voltage to be sampled in discrete durations of time. The sampled input voltage is fed into one input of a comparator 104. An output of the comparator 104 drives a logic circuit 106 which, in turn, controls the settings of a DAC 108. An output of DAC 108 is fed into another input of the comparator 104. The output of DAC 108 is designed to converge upon a reference voltage over a series of clock cycles such that the input to control lines of the DAC 108 determines the output of the CR-SAR ADC 100.

FIG. 2 is a simplified schematic of a standard 4-bit binary top-plate sampling DAC, hereinafter DAC 208, used in a known single-ended CR-SAR ADC 200. In the known CR-SAR ADC 200, the DAC 208 generally comprises a set of capacitors 210a-210e having a sequentially decreasing value. A largest capacitor 210a has a capacitance that is roughly equal to a sum of capacitors 210b-210e. Thus, if a value of capacitor 210a is C, the total capacitance is usually 2C. To simplify operation, each capacitor 210b-210e is smaller in value than its preceding capacitor by roughly half its value until the final capacitor 210e provides a needed capacitance such that the total capacitance is 2C. In the example of FIG. 2, the total capacitance is C+C/2+C/4+C/8+C/8=2C. In a default state, logic circuit 206 originally sets switches 212a-212d such that the largest capacitor 210a is connected to VrefP and the remaining capacitors 210b-210e are connected to VrefN. This configuration sets a comparison voltage Vref at roughly halfway between VrefP and VrefN, i.e., Vref=(VrefP−VrefN)/2. Control lines to the DAC 208 (i.e., the connections to the "opposite" (i.e., non-Vin) side of each capacitor) are reset to a fixed value during sampling. Thus, initial logic for a default state is '1000', where the most significant bit corresponds to the switch 212a setting for capacitor 210a. During each clock cycle, the comparator 204 makes a decision as to whether the input voltage is greater than or less than a comparison voltage (shown by dashed line 302 in FIG. 3) provided by the output of the DAC 208, and the logic 206 adjusts the output of the DAC accordingly.

A known analog-to-digital conversion process is depicted in FIGS. 3-6. FIG. 3 is schematic of the DAC 208 used in the known single-ended CR-SAR ADC 200 in a sample phase, and a corresponding graph 301 of output voltage versus time. Switch 202 is closed and the input voltage is sampled on a top-plate, i.e., at a common node of capacitors 210a-210e that is connected to Vin; therefore, Vout=Vin at this moment.

FIG. 4 is schematic of the DAC 208 used in the known single-ended CR-SAR ADC 200 in phase one of a conversion phase 400, and a corresponding graph 401 of output voltage versus time. Sampling stops and comparator 204 makes a decision. Because Vout>Vcomp (see dashed line 302) in this case, the output is '1'. This means that an output of the DAC 208 needs to go from '1000' to '0100'. The comparator 204 checks to see if Vout is larger than half of a range of the DAC 208. Because Vout is larger, the voltage is then checked during a next clock cycle to see whether it is larger than $\frac{3}{4}^{th}$ of the range of the DAC 208, which is done by lowering the sampled value. Switching of the most significant bit (MSB) (switch 212a) to ground and the next bit (MSB+1) (switch 212b) to VrefP, creates a quarter Vref step.

FIG. 5 is schematic of the DAC 208 used in the known single-ended CR-SAR ADC 200 in phase two of the conversion phase 500, and a corresponding graph 501 of output voltage versus time. The comparison is performed again, and Vout is smaller than the comparator threshold (i.e., dashed line 302). The digital output for this bit is '0', so the signal is shifted $\frac{1}{8}^{th}$ of Vref higher for the next comparison, to '0110'. Overall, the first step shifted $\frac{1}{4}^{th}$ of Vref down, and the second step shifted $\frac{1}{8}^{th}$ of Vref up; therefore, a total is $\frac{1}{8}^{th}$ of Vref down.

FIG. 6 is schematic of the DAC 208 used in the known single-ended CR-SAR ADC 200 upon completion of the conversion phase 600, and a corresponding graph 601 of output voltage versus time.

Note that the DAC 208, in this example, works opposite to the digital output. The output here is '1010', while the DAC 208 is set to '0101'. This is because if a value of Vout is higher than a threshold of the comparator 204, the digital output for that bit is '1', but for the next comparison the DAC 208 needs to lower the value to see if, after lowering it, Vout is still larger than a threshold of the comparator 204.

FIG. 7 shows a diagram of a state machine 700 depicting a "set/reject" algorithm described above in relation to the known CR-SAR ADC 200. The state machine 700 has two steps. In step S702, the input voltage is sampled. In step S704, the conversion phase occurs and where conversion determines the DAC voltage as a function of the comparator 204 and continues for each bit of the DAC, at step S706.

FIG. 8 is a simplified schematic 800 of an actual implementation of the switching used in the known CR-SAR ADC 200. Each DAC logic input (i.e., switches 212a-212c in FIG. 2) is usually performed by a DAC driver, typically via single-input inverter 304a-304c, respectively, as shown in the simplified schematic 800. Not shown in the simplified schematic 800 is an inverter that implements switch 212d of FIG. 2.

FIG. 9 shows an example of a known differential CR-SAR ADC 900. In contrast to the known single-ended CR-SAR ADC 100, the input is sampled on two DACs 904a and 904b, and the reference voltage is absent as it is generated by interpolation by the DACs, but the working principle is the same. A reference point of VinP is VinN instead of ground which is the case for a single-ended implementation. The incoming voltages VinP and VinN are sampled by closing the sample-and-hold switch(s) 902a, 902b (referenced generally or collectively herein as "sample-and-hold switch 902"). For clarity and convenience, sample-and-hold switch 902 may be referenced from this point on as "Vin" to describe the differential input signal. The sampled Vin "floats" at the input of the differential comparator 906 and is thus affected by the outputs of each DAC 904a, 904b (referenced generally or collectively herein as "differential DAC 904"). The output of comparator 906 is determined by a difference between the input voltages, which then determines logic 908 that is presented to control lines of the DAC 904. The logic 908 changes each clock cycle until each DAC bit value has been determined. There are two "split-capacitor" DACs 904 in the CR-SAR ADC 900 of FIG. 9.

FIG. 10 is a schematic of one of the two known differential split-capacitor DACs 904 shown in FIG. 9, for example DAC 904b. Practical implementation of drivers for the DAC 904b uses single-input inverters 1002a-1002c, 1004a-1004c as switches on control lines to the DAC, as shown in FIG. 10. The differential DAC 904 is sampled simultaneously at plates of capacitors 1006a-1006c, 1008a-1008c, i.e., specifically the plates connected to a common node of the capacitors, wherein the common node is connected to Vin.

FIG. 11 illustrates the basic working principle of a 4-bit sampling DAC 1100 such as DAC 904b of the known differential CR-SAR ADC 900 through four clock cycles. FIG. 11 shows repositioning of switches and a corresponding output voltage of the DAC 1100 during each step of the conversion process. For the purpose of simplicity, FIG. 11 shows only the switched capacitors in DAC 904b. Not shown is another capacitor having a value of $\frac{1}{16}^{th}$ of the total capacitance of DAC 904b. The structure and operation of DAC 904a is similar to those of DAC 904b.

The DAC 1100 includes a top-plate sampling, split-capacitor array of which half of the DAC is normally set to the positive reference and the other half is set to the negative reference during a reset mode. For convenience of illustration, the positive reference in this example is set to 1V and the negative reference is set to 0V. Although this nomenclature is used in this disclosure, the reference voltages may have other values and are not limited herein by the invention.

In the first phase (i.e., clock cycle '1') the signal is sampled on the DAC 1100 which is in the reset state (i.e., bottom half of the capacitors is set to 0V, top half is set to 1V).

After sampling, the DAC 1100 is switched according to the input, so $V_{sample}-V_{DAC}$ converges to 0. Either the positive half is switched from 1V to 0V, or the negative half is switched from 0V to 1V during each clock cycle. Between the phases and after the last phase, the comparator 906 decides a direction of a next bit. In an ideal case, the conversion result would become '0101'.

FIG. 12 shows a diagram of a state machine 1200 for the known differential CR-SAR ADC 900. As with the state machine 700 for the known single-ended version, the state machine 1200 has only two steps: the sampling phase, at step S1202, and the conversion phase, at step S1204. A difference between the state diagrams is that, with state machine 1200 coding provides settings for two DACs which have an architecture that uses twice the control signals as a "set/reject" DAC (e.g., DP_BOT, DP_TOP, DN_BOT and DN_TOP). The conversion phase continues for each bit of the DAC, at step S1206.

BRIEF DESCRIPTION OF THE DRAWINGS

The invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 13:
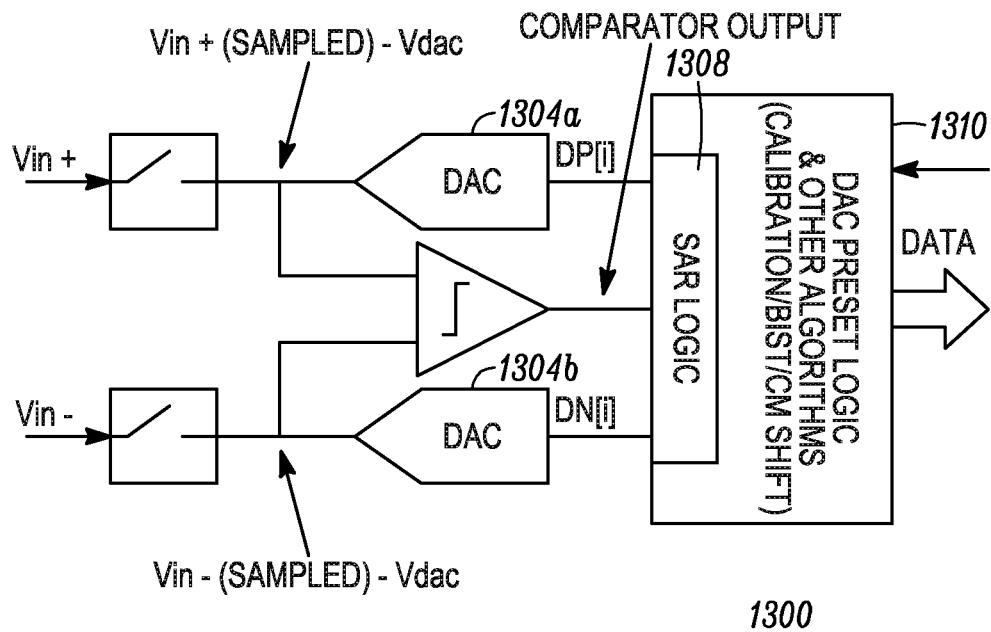
FIG. 13 is a block diagram of one embodiment of a differential CR-SAR ADC, including two differential DACs in accordance with the invention.

FIG. 13 is a block diagram of a differential CR-SAR ADC 1300 in accordance with one embodiment of the invention. The invention is not limited to a CR-SAR ADC, but for the sake of explanation a CR-SAR ADC is used as an example. The concepts of the invention may be applied to any top-plate sampled circuit where the sampling capacitor can be altered during sampling and thereafter. For example, the concepts are also applicable to a circuit that samples a signal and drives a buffer. If the buffer has an offset, the offset can be compensated during a sampling/superposition phase. The differential CR-SAR ADC 1300 includes a sampling DAC 1304a and a sampling DAC 1304b, hereinafter DAC 1304a and DAC 1304b. The differential CR-SAR ADC 1300 includes a comparator 1301 having inputs coupled to an output of DAC 1304a and to an output of DAC 1304b, and having an output coupled to logic block 1308.

Embodiments of the invention may also be used with any circuit that uses a sampling DAC. Embodiments of the invention may be used for 1) offset compensation, 2) common mode shift, and 3) self-test. The differential CR-SAR ADC 1300 expands upon the operational concepts described above for the known differential CR-SAR ADC 900 in several notable ways. The differential CR-SAR ADC 1300 alters the reset value of DAC 1304a and DAC 1304b during the sampling phase, adding a digital value of choice to the reset state through an additional phase occurring between sampling and conversion, called a superposition phase. Logic block 1308 controls the operation of state machine 1500 (see FIG. 15) during the conversion phase. Additional logic 1310 determines a superpositioned value by setting a custom, predetermined voltage on the outputs of DAC 1304a and DAC 1304b by programming values on the control lines of the DACs, as well as controlling other functionality to be discussed below. In order to place DAC 1304a and DAC 1304b into the superposition phase, each driver of the known DAC 904b (i.e., the single-input inverters 1002a-1002c, 1004a-1004c) is replaced with a two-bit digital multiplexer (MUX) that multiplexes the inputs to the DAC 1304a and DAC 1304b from a preset state (superposition phase) to a normal operation state (conversion phase).

Figure 1:
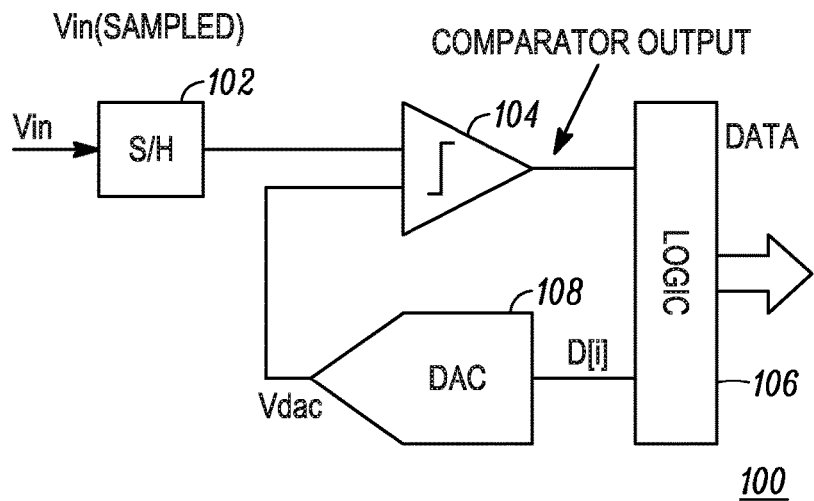
FIG. 1 is a simplified block diagram of a known single-ended charge redistribution, successive approximate register (CR-SAR) ADC with a set/reject DAC architecture.
Figure 2:
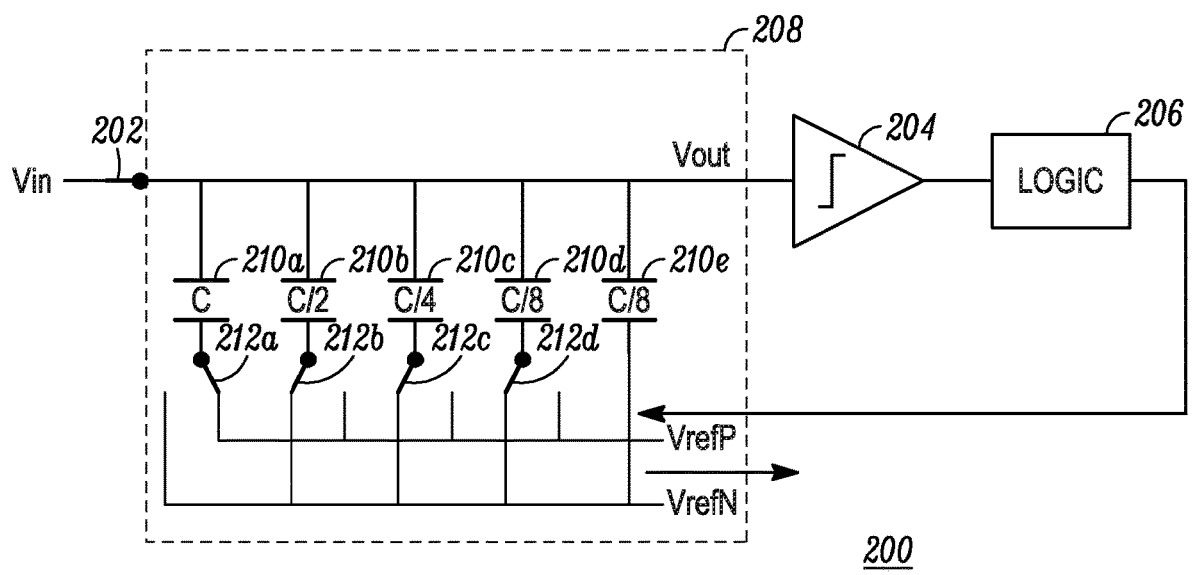
FIG. 2 is a simplified schematic of a known single-ended top-plate sampling CR-SAR ADC with a standard 4-bit binary DAC.
Figure 3:
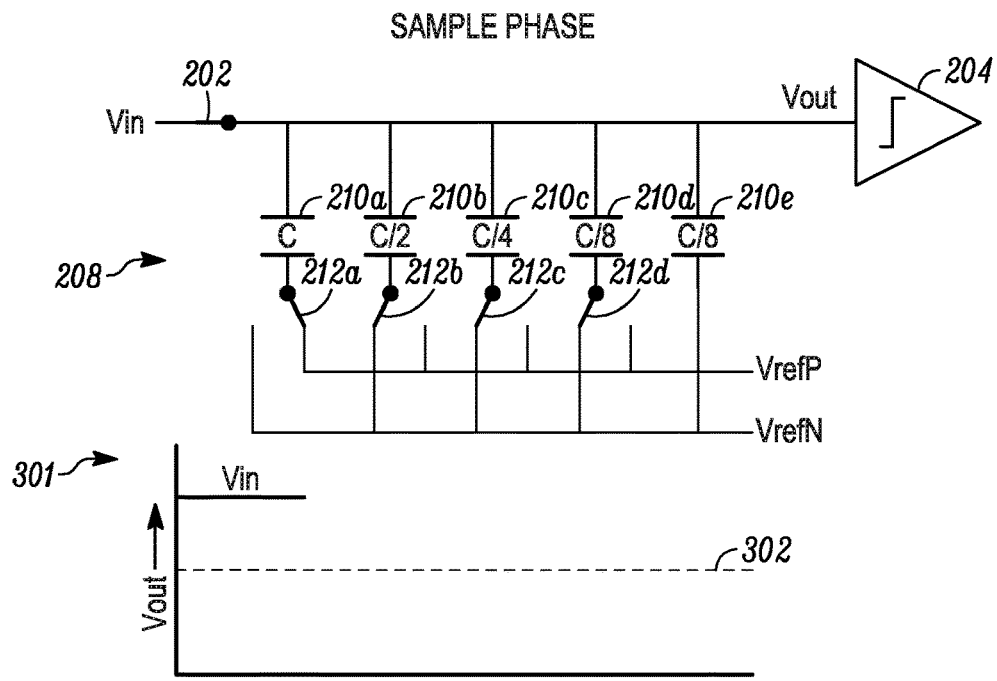
FIG. 3 is schematic showing a portion of the known single-ended top-plate sampling CR-SAR ADC of FIG. 2 in a sample phase with a corresponding output voltage vs. time graph.
Figure 4:
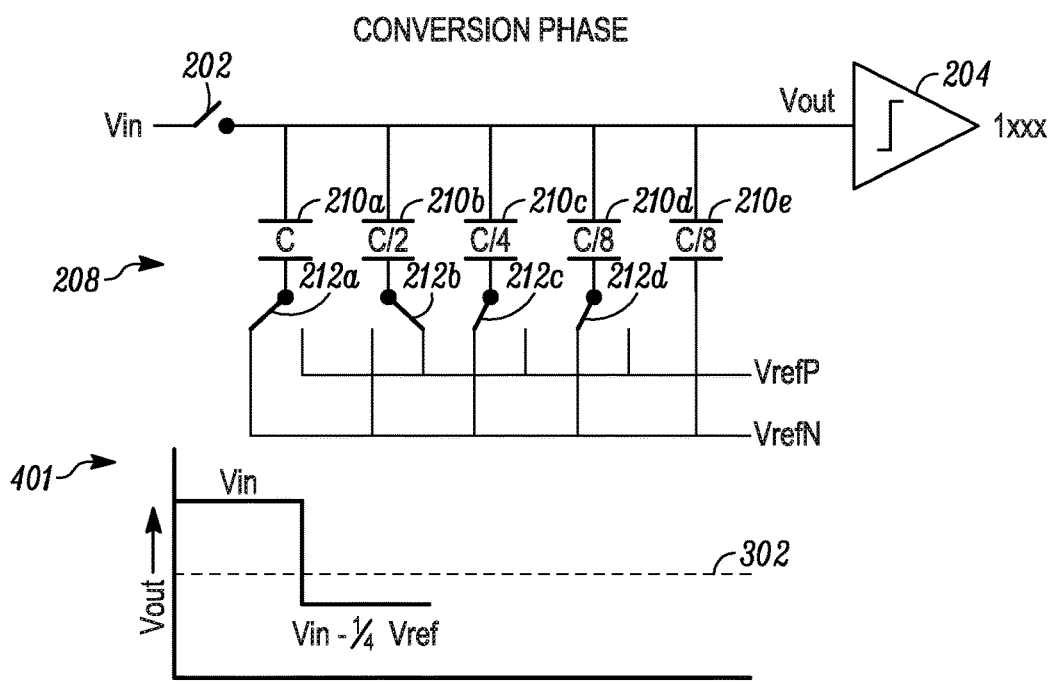
FIG. 4 is schematic showing a portion of the known single-ended top-plate sampling CR-SAR ADC of FIG. 2 in phase one of a conversion phase with a corresponding output voltage vs. time graph.
Figure 5:
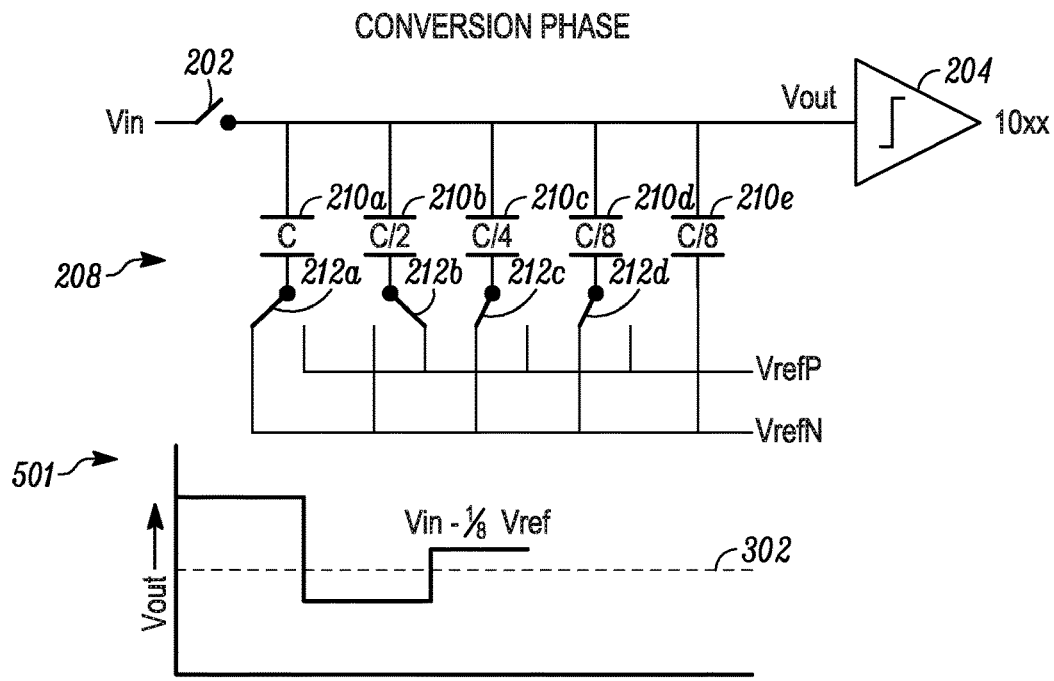
FIG. 5 is schematic showing a portion of the known single-ended top-plate sampling CR-SAR ADC of FIG. 2 in phase two of the conversion phase with a corresponding output voltage vs. time graph.
Figure 6:
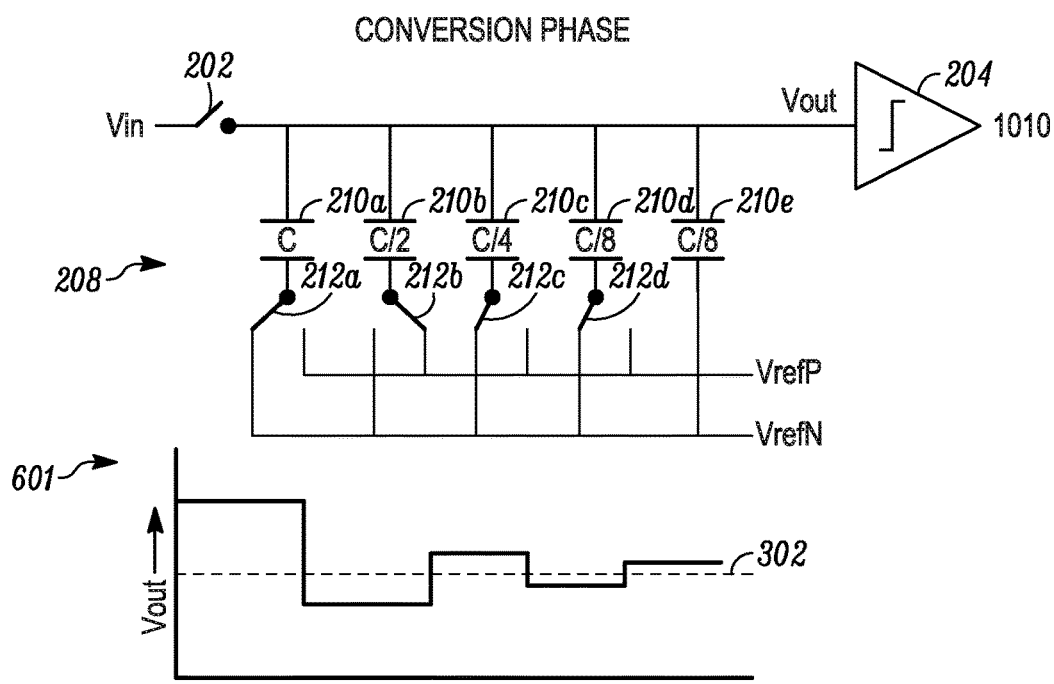
FIG. 6 is schematic showing a portion of the known single-ended top-plate sampling CR-SAR ADC of FIG. 2 upon completion of the conversion phase with a corresponding output voltage vs. time graph.
Figure 7:
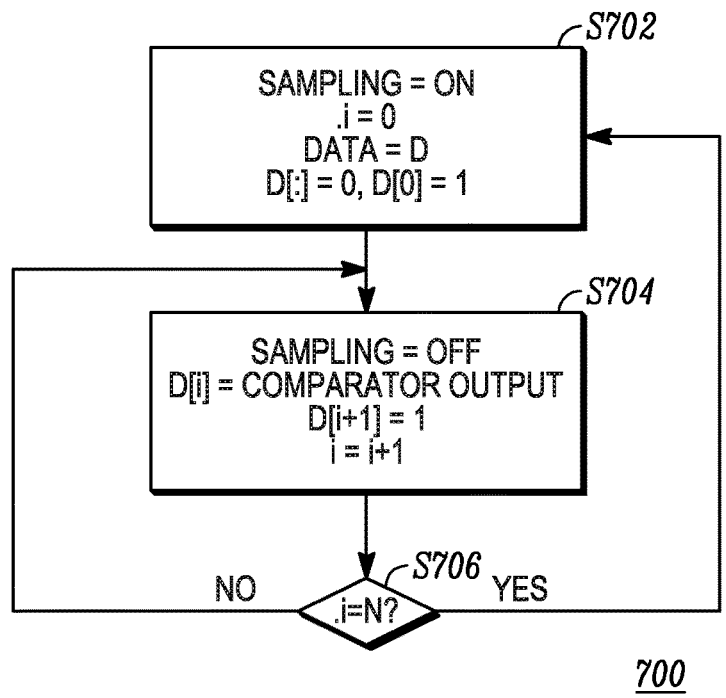
FIG. 7 is a state diagram showing the operation of the known top-plate sampling CR-SAR ADC of FIG. 2.
Figure 8:
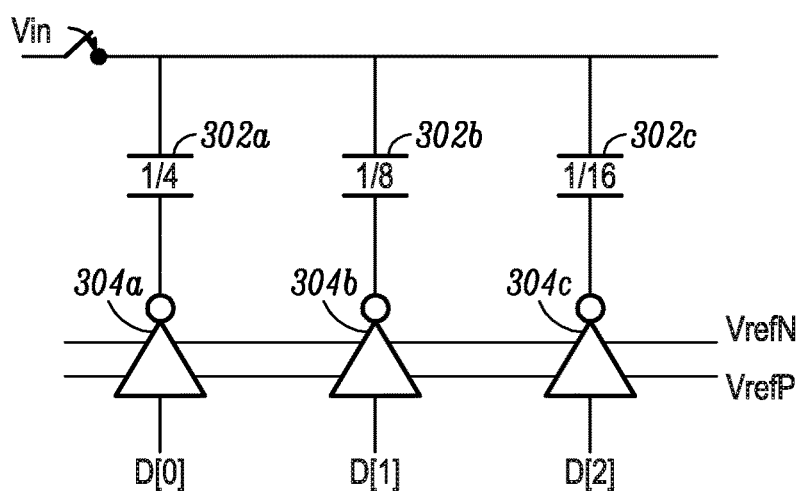
FIG. 8 is a schematic of the known top-plate sampling CR-SAR ADC of FIG. 2, including implementation of the switching function via single-input inverters.
Figure 9:
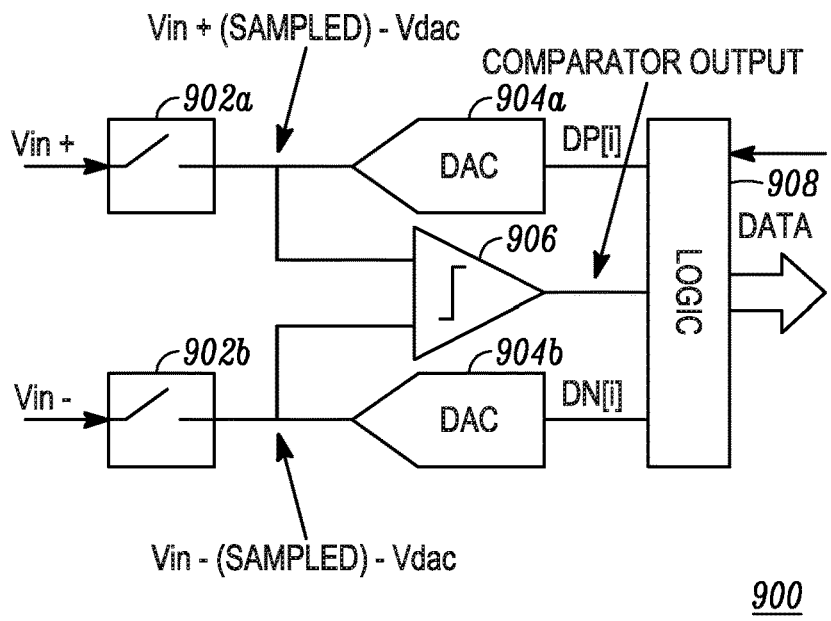
FIG. 9 is a simplified block diagram of a known differential CR-SAR ADC.
Figure 10:
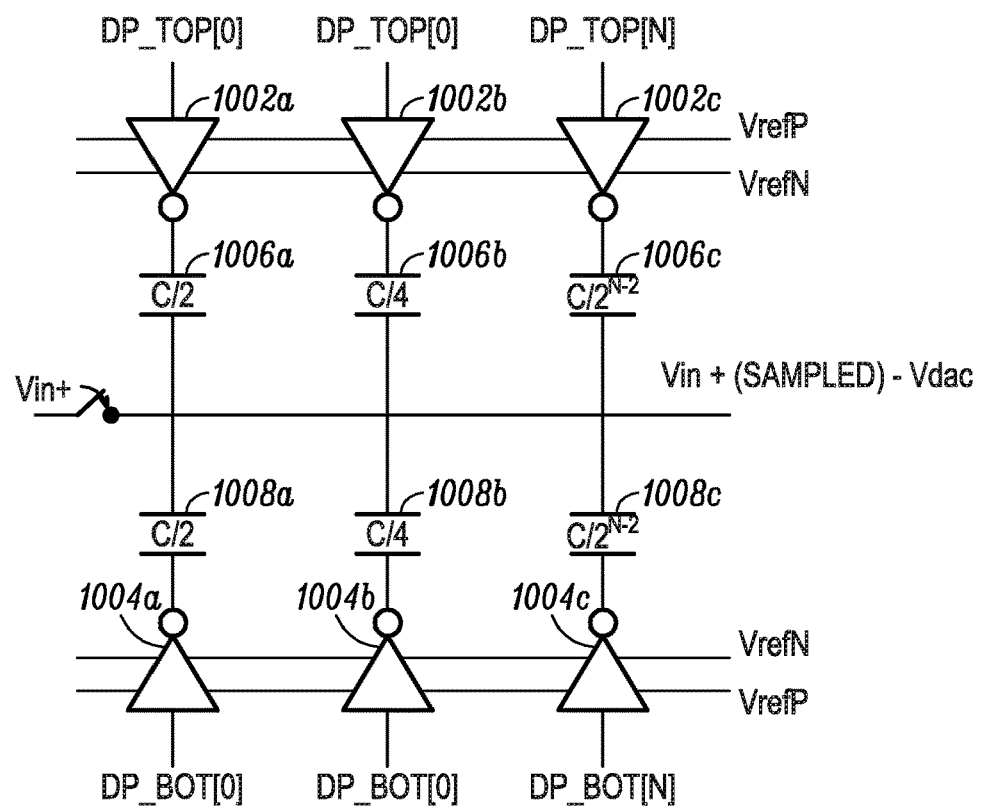
FIG. 10 is a schematic of a differential DAC of the known differential CR-SAR ADC of FIG. 9, including implementation of the switching function via single input inverters.
Figure 11:
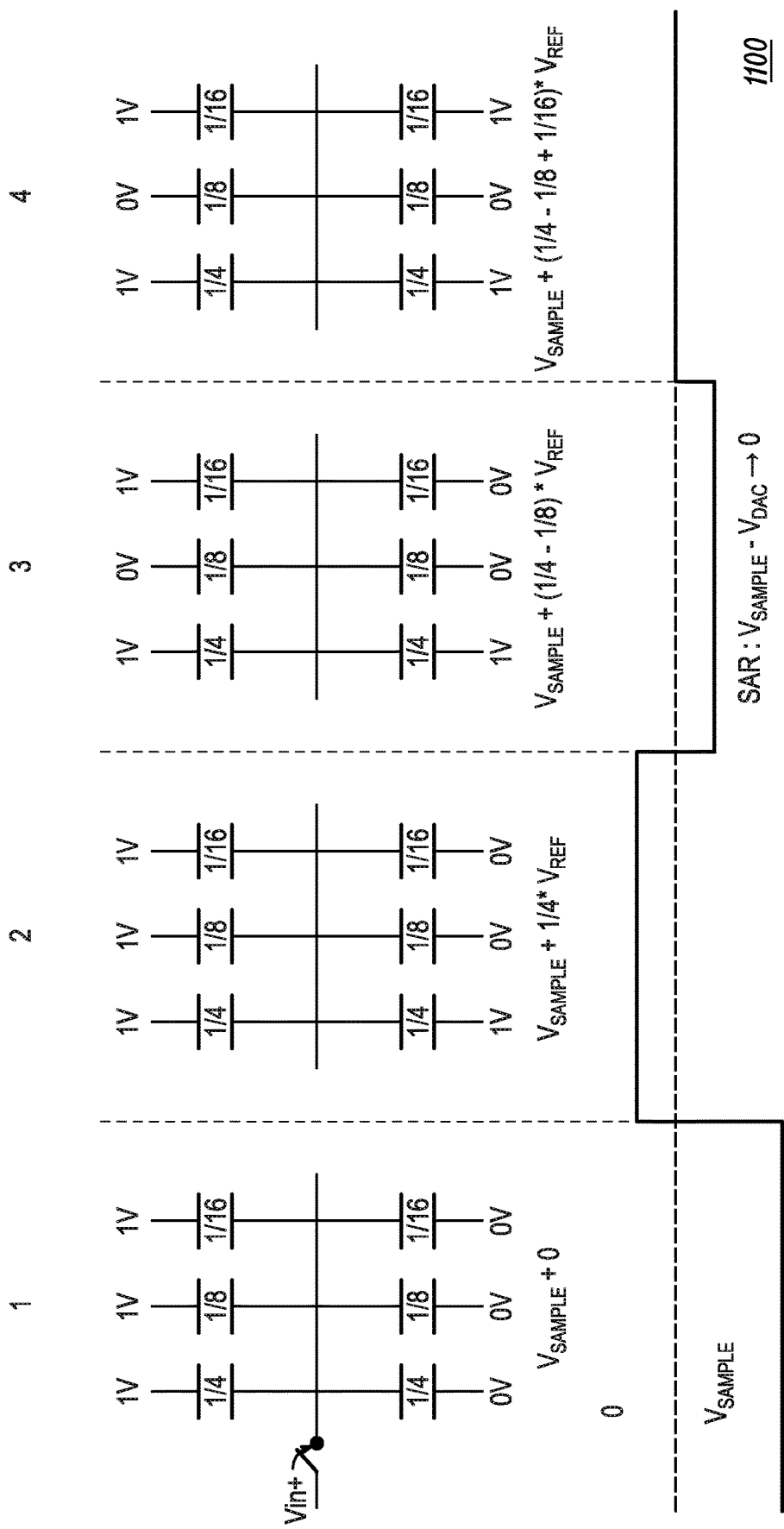
FIG. 11 is a simplified schematic of the differential DAC of the known "split-capacitor" CR-SAR ADC of FIG. 9 showing the repositioning of switches and corresponding output voltage during each step of the conversion phase, in accordance with the invention.
Figure 12:
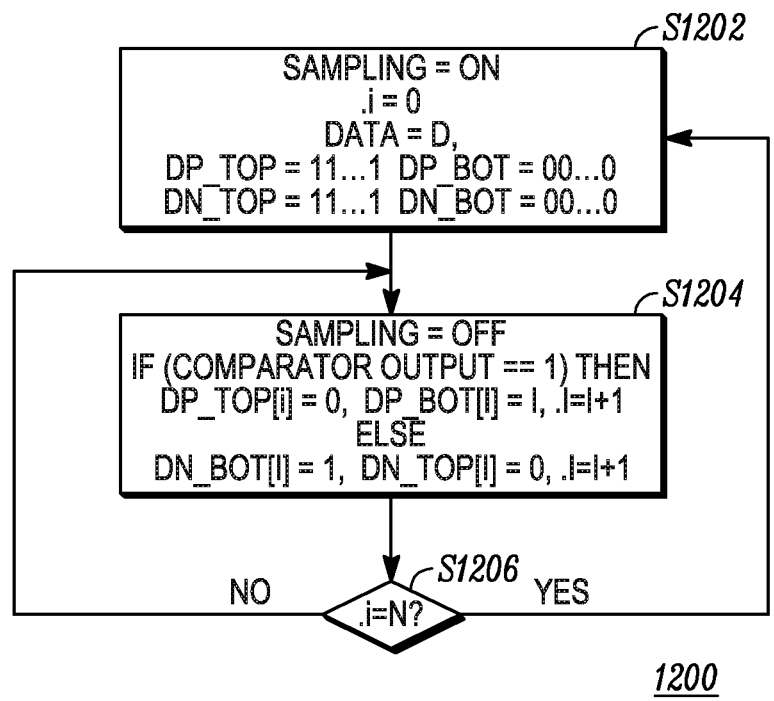
FIG. 12 is a state diagram showing operation of the known differential CR-SAR ADC of FIG. 9.
Figure 14:
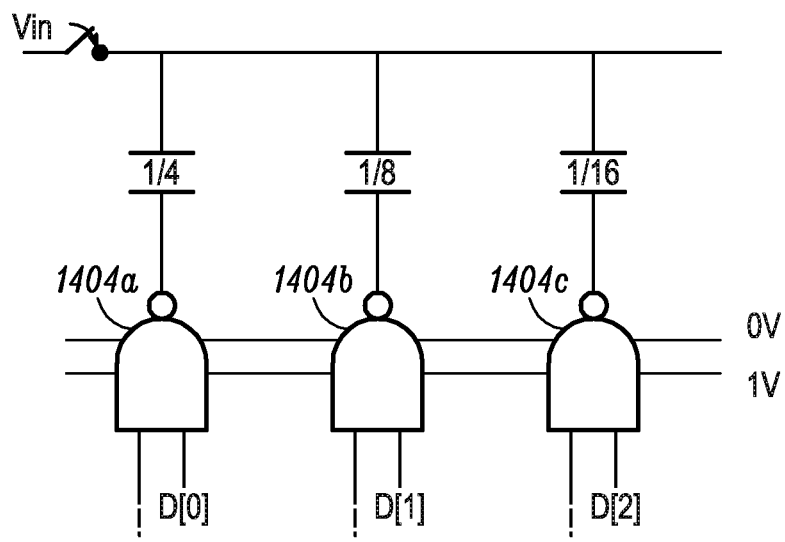
FIG. 14 is a simplified schematic of one side of one differential DAC of the two differential DACs in the differential CR-SAR ADC of FIG. 13, in accordance with the invention.

FIG. 14 is a simplified schematic of one side of DAC 1304b of the two DACs in the differential CR-SAR ADC 1300, in accordance with the invention. FIG. 14 shows one side of DAC 1304b whereby a multiplexing capability is achieved by replacing the single-input inverters shown in FIG. 10 with NAND gates 1404a-1404c which have two inputs. Only DAC 1304b is discussed in more detail inasmuch as the structure and operation of DAC 1304a in analogous to DAC 1304b.

Figure 15:
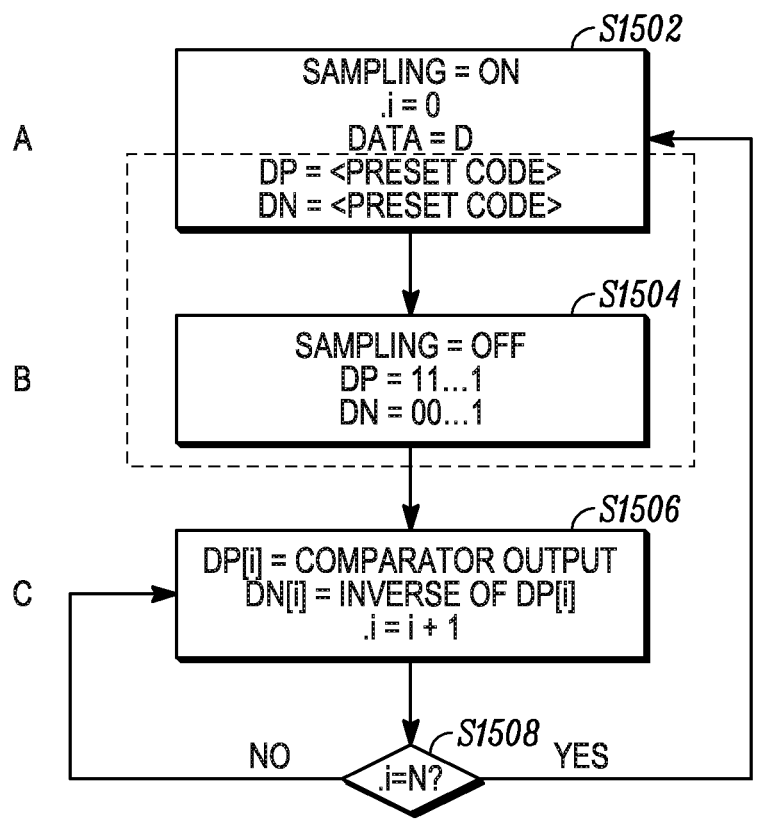
FIG. 15 is a state diagram showing the operation of the differential CR-SAR ADC of FIG. 13 in accordance with the invention.

FIG. 15 a diagram of a state machine 1500 regarding the operation of the differential CR-SAR ADC 1300 in accordance with the invention. A third state $1504 (referenced herein as the "superposition state" or "superposition phase") is added between the sampling state S1502 and the conversion state $1506. The superposition state $1504 allows for signal generation between the sampling phase S1502 and the conversion phase $1506. During the sampling phase S1502, the "reset state" of the DAC (i.e., the state of DAC 1304b during sampling) is modified. Note that DP and DN have been changed from the default values of "1" for each DP and "0" for each DN, to any preset value. This change in DP and DN values injects an analog DC offset in the Vin signal which is translated from the modified code in the new superposition phase $1504.

Figure 16:
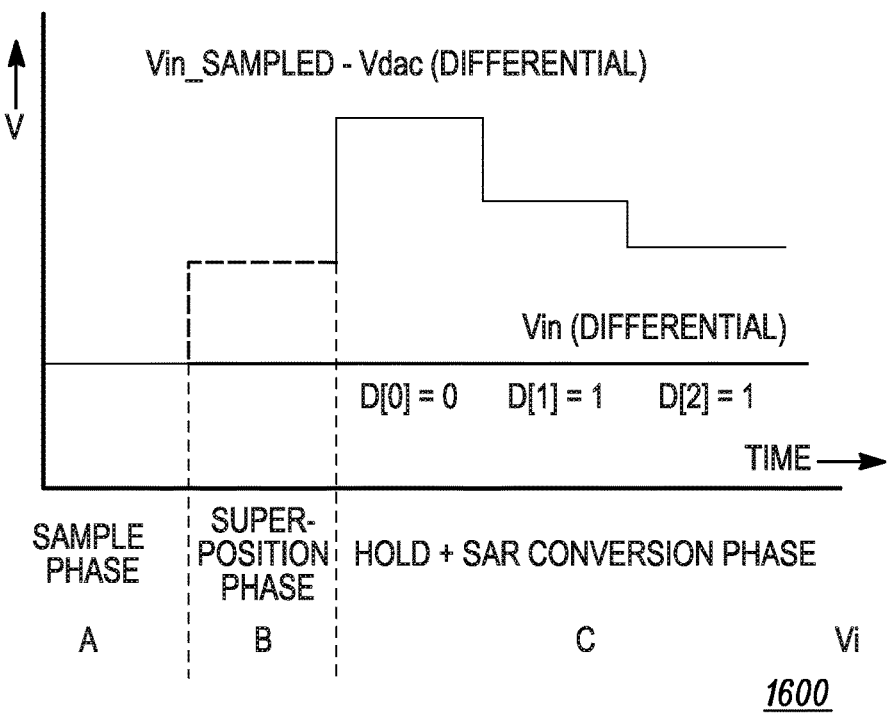
FIG. 16 is an output voltage vs. time graph of the differential CR-SAR ADC of FIG. 13 in accordance with the invention.

FIG. 16 illustrates a graph 1600 of Vin_sampled versus time for the different states of state machine 1500. An actual voltage graph is dependent upon the code presented. During the time frame of sampling phase A, the sample switch is closed and the ADC is sampling. The DAC 1304b is preset with some value which would, in this case, shift up the output of the DAC.

During the time frame of the superposition phase B, the sample switch is opened, and the DAC is set in its normal reset state. The preset values on the control lines of DAC 1304b translates the digital preset code to an analog voltage on the DAC output because the DAC output is floating which is intended to enable charge redistribution (CR).

During a time frame of the conversion phase C, the SAR ADC continues its normal operation and uses the DAC as previously described. The preset code is determined by application or function and is decided by either the output of the SAR ADC, or (e.g., to save some time) by only the output of the comparator 1301. The SAR state machine 1500 with the superposition state for signal injection is therefore controlled by another piece of logic such as logic 1310 (i.e., a hierarchical layer on top of the SAR).

Figure 17:
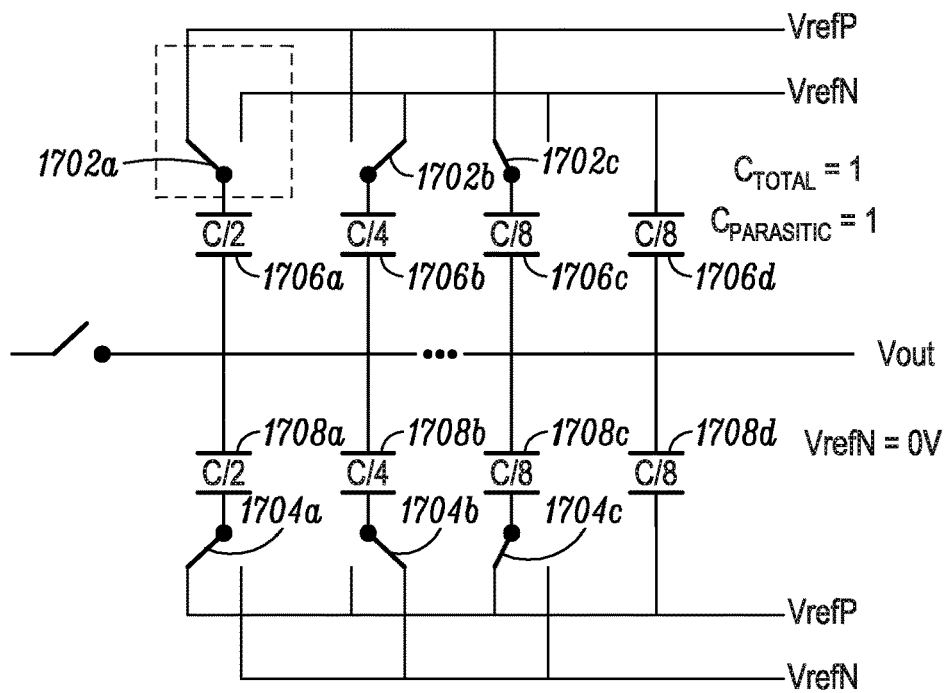
FIG. 17 is a schematic of a portion of a known differential DAC.

In FIG. 17, an example of a known CR-SAR ADC 1700 is shown to illustrate mathematical concepts behind the operation. In the sample-and-hold phase, top halves of the capacitors 1706a-1706d are connected to VrefP and bottom halves of the capacitors 1708a-1708d are connected to VrefN. When the SAR search algorithm starts, Vout is a floating node; therefore, its value can be changed by switching the capacitors from VrefP to VrefN or vice versa. Switching is done one pair per clock cycle, from the largest capacitor 1706a, 1708a to the smaller capacitors 1706b (i.e., capacitors 1706b, 1708b, then capacitors 1706c, 1708c . . . ). In FIG. 17, the final configuration of switches 1702a-1702c, 1704a-1704c is shown (i.e., after the conversion phase has completed). For each half bank of capacitors, $C_{total}$ equals C. $C_{parasitic}$ is assumed to be 0 pF for the ideal case. VrefN=0V. For code "101", capacitor 1706b in the upper half, having a value of C/4 is switched from VrefP to VrefN. In the lower half, capacitor 1708a having a value of C/2 and capacitor 1708c having a value of C/8 are both switched from VrefN to VrefP. The formula for Vout is:

$$V_{out} = V_{in,sampled} - V_{dac} \quad (1)$$

where $$V_{dac} = \left( \frac{\sum C_{VrefN \to VrefP} - \sum C_{VrefP \to VrefN}}{C_{total} + C_{parasitic}} + \frac{1}{2} \right) * (Vrefp - VrefN) \quad (2)$$

The "→" symbol in the above equation represents the units switched "from → to". The "½" comes from the default setting of the switches during sampling. Therefore, for the example of FIG. 17, for code "101":

$$V_{dac} = \left( \frac{\left(\frac{4}{8} + \frac{1}{8}\right) - \frac{2}{8}}{2 + 0} + \frac{1}{2} \right) * (Vrefp - VrefN) = \frac{8}{16} + \frac{3}{16} * VrefP \quad (3)$$

Thus, $$V_{out} = V_{in,sampled} - \frac{11}{16} * VrefP \quad (4)$$

Figure 18:
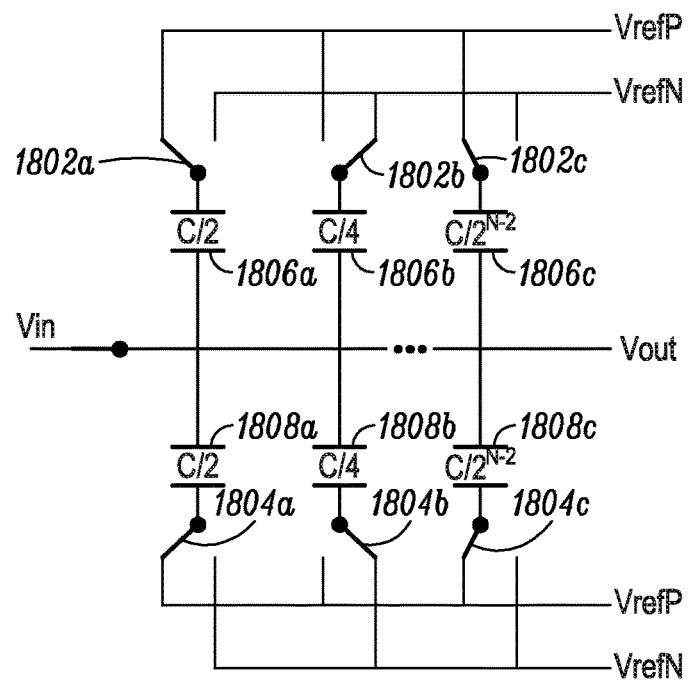
FIG. 18 is a schematic of the example differential CR-SAR ADC of FIG. 17 showing the repositioning of switches from a default reset state during a superposition phase, in accordance with the invention.

FIG. 18 shows a portion of a DAC 1800 for a CR-SAR ADC in accordance with the invention in the sampling phase. The portion of the DAC 1800 shows an upper bank of switchable capacitors 1806a-1806c and lower bank of switchable capacitors 1808a-1808c. Although not shown, it is understood that a non-switchable capacitor is also present in each bank, each having a value of $C/2^{i-2}$ for i many capacitors. It should be noted that the switches 1802b, 1804a and 1804c are not shown in a standard reset position which is that each capacitor 1806a-1806c in the upper bank is connected to VrefP and each capacitor 1808a-1801c in the lower bank is connected to VrefN. Instead, capacitor 1806b in the upper bank is shown switched to VrefN and capacitors 1808a and 1808c in the lower bank are shown switched to VrefP.

Figure 19:
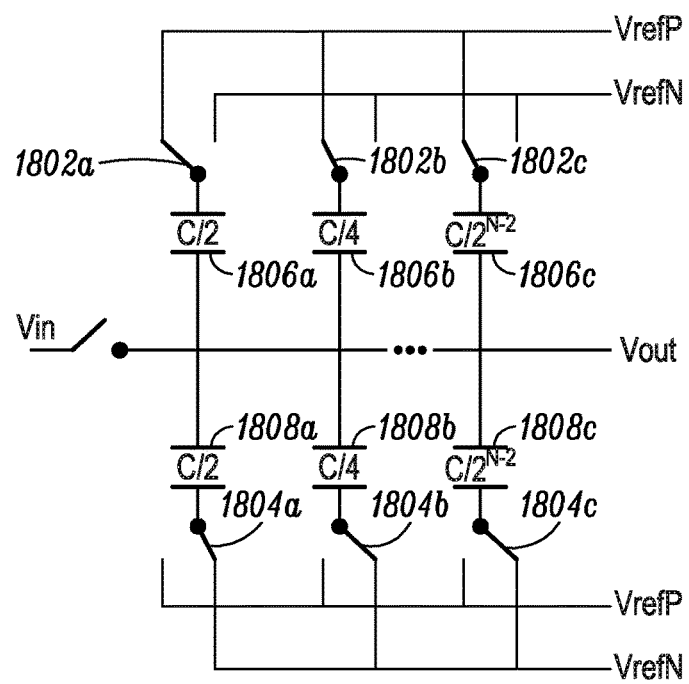
FIG. 19 is a schematic of the example differential CR-SAR ADC of FIG. 17 showing the repositioning of switches to the default reset state during the superposition phase, in accordance with the invention.

FIG. 19 illustrates positions of switches 1802a-1802c and 1804a-1804c in the portion of the DAC 1800 during the superposition phase. When the default setting is changed while sampling and then set back to the default setting after the sampling has finished (e.g., during the "superposition" phase), an analog DC value is injected (i.e., "superposed") upon the sampled signal as Vout. After the superposition phase, conversion may proceed as normal. Now, $$V\text{out} = V\text{in} + V\_\text{superpose} - V\text{dac}, \quad (5)$$

where V_superpose is dependent upon the position of the switches set in the sampling phase.

Figure 20:
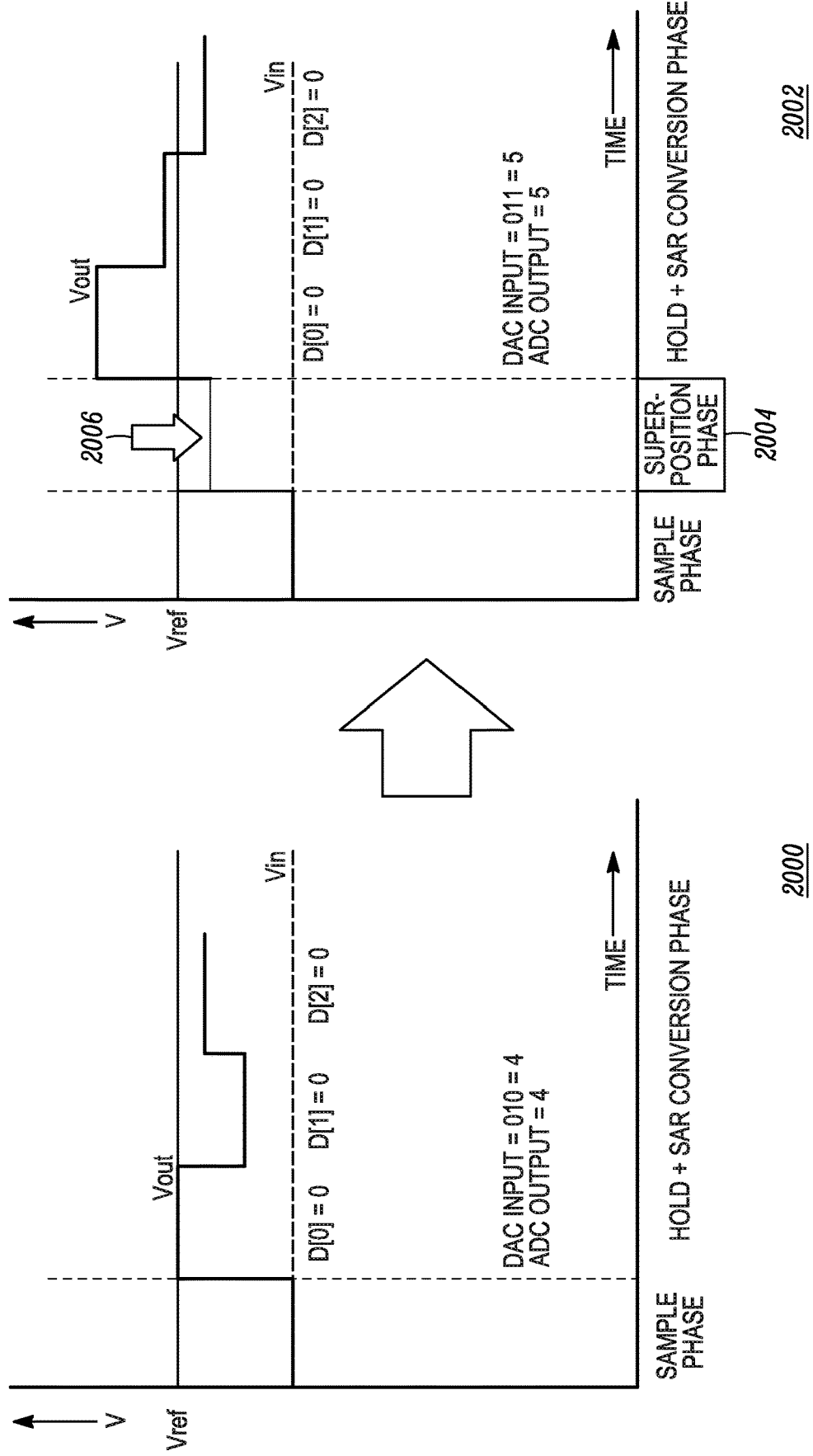
FIG. 20 shows graphs of output voltage vs. time depicting the effect of insertion of a superposition phase in the operation of the example differential CR-SAR ADC of FIG. 17, in accordance with the invention.

FIG. 20 shows graphs of output voltage versus time showing the effect of insertion of a superposition phase in the operation of the known CR-SAR ADC 1700, thereby producing a CR-SAR ADC in accordance with the invention. The graph 2000 shows the original SAR ADC conversion. The graph 2002 shows Vout in accordance with the invention.

In graph 2002, the extra superposition phase 2004 is added where an arbitrary voltage 2006 is added to Vout, which in this case, increases Vout a little. Because Vout is shifted, the SAR algorithm will converge to something else as 0V is the reference.

Referring back to the original Vout formula:

$$V_{out} = V_{in,sampled} - V_{dac} \quad (1)$$

where $$V_{dac} = \left( \frac{\sum C_{VrefN \to VrefP} - \sum C_{VrefP \to VrefN}}{C_{total} + C_{parasitic}} + \frac{1}{2} \right) * (Vrefp - VrefN) \quad (2)$$

Recall that the "½" from the main formula (2) represents the DAC state during sampling. Therefore, if this setting is changed during sampling and reset before converting, the ½ is changed into whatever value is needed. The sign of the ½ is changed due to the "superposition" phase as it works in the opposite direction.

$$V_{dac} = \left( \frac{\sum C_{VrefN \to VrefP} - \sum C_{VrefP \to VrefN}}{C_{total} + C_{parasitic}} - \frac{\sum C_{VrefN \to VrefP} - \sum C_{VrefP \to VrefN}}{C_{total} + C_{parasitic}} \right) * (Vrefp - VrefN) \quad (6)$$

Therefore, an analog signal can be superposed onto Vin, and a conversion performed afterwards using the same hardware.

Use Cases

Offset Compensation

Figure 21:
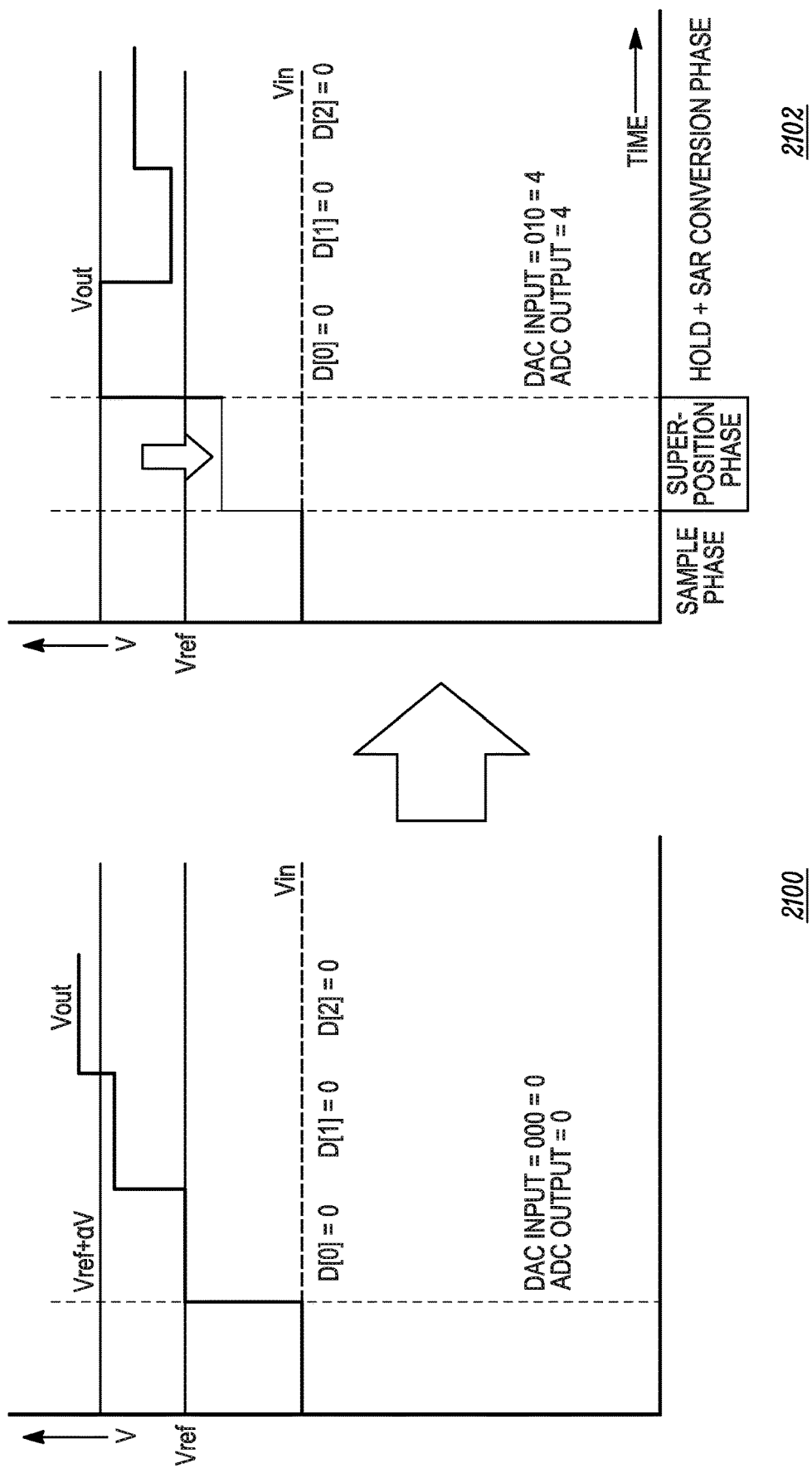
FIG. 21 shows graphs of output voltage vs. time depicting the operation of the example differential CR-SAR ADC of FIG. 17 and illustrating the resulting voltage offset generated, in accordance with the invention.

FIG. 21 shows graphs of output voltage versus time depicting the operation of the example differential of the CR-SAR ADC 1700 and illustrating the resulting voltage offset generated in accordance with the invention. FIG. 21 illustrates a situation in which the comparator determines that convergence of the SAR algorithm has an offset error, and that the 0V reference that the comparator sees is +αV. In such case, the normal conversion result without the superposed signal will disadvantageously contain the same error (graph 2100). But, if the same αV is superposed onto the Vout signal in the superposition phase in accordance with the invention, the ADC advantageously converges to the correct output because αV is compensated (graph 2102). This is offset correction by the generated signal.

Common-Mode Shift

Figure 22:
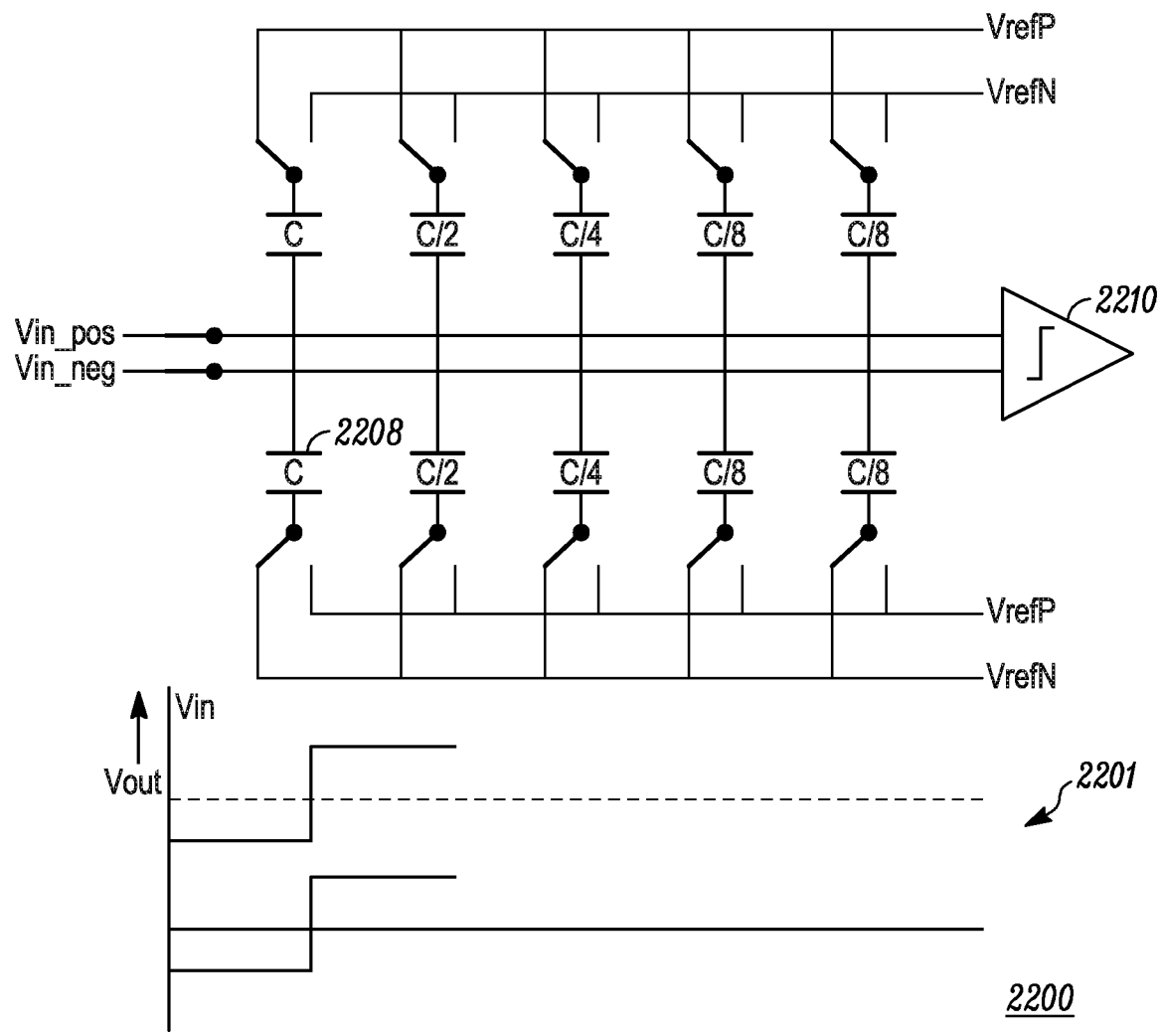
FIG. 22 is a schematic of another example of a differential CR-SAR ADC and a corresponding output voltage vs. time graph illustrating a common mode shift, in accordance with the invention.

FIG. 22 is a schematic of another example of a CR-SAR ADC 2200 and a corresponding graph 2201 of output voltage versus time illustrating a common mode shift in accordance with the invention. Common-mode shift of the input signal is useful when following circuitry introduces common-mode dependent errors. For example, an NMOS input pair requires a certain Vgs, and, when it is too low, the NMOS input pair might not function properly. The CR-SAR ADC 2200 illustrates a problem occurring when a comparator 2208 can have an input operating range that is higher than an average input level of the ADC 2200. For simplicity and to show that the invention is not DAC architecture dependent, another DAC architecture is used namely the set/reject architecture as previously shown in the known for the single ended SAR ADC. By means of analog level shifting (for both the reference and the sampled input signal), the comparator 2210 can work again. Comparators need a minimum (and maximum) common mode voltage on their input to function. If the common mode of the input signal is, for example, around 0V, then by sampling on '0000', and switching next to the reset state of '1000', a common mode shift of roughly half Vref is applied, and the comparator can function.

Self-Test

Figure 23:
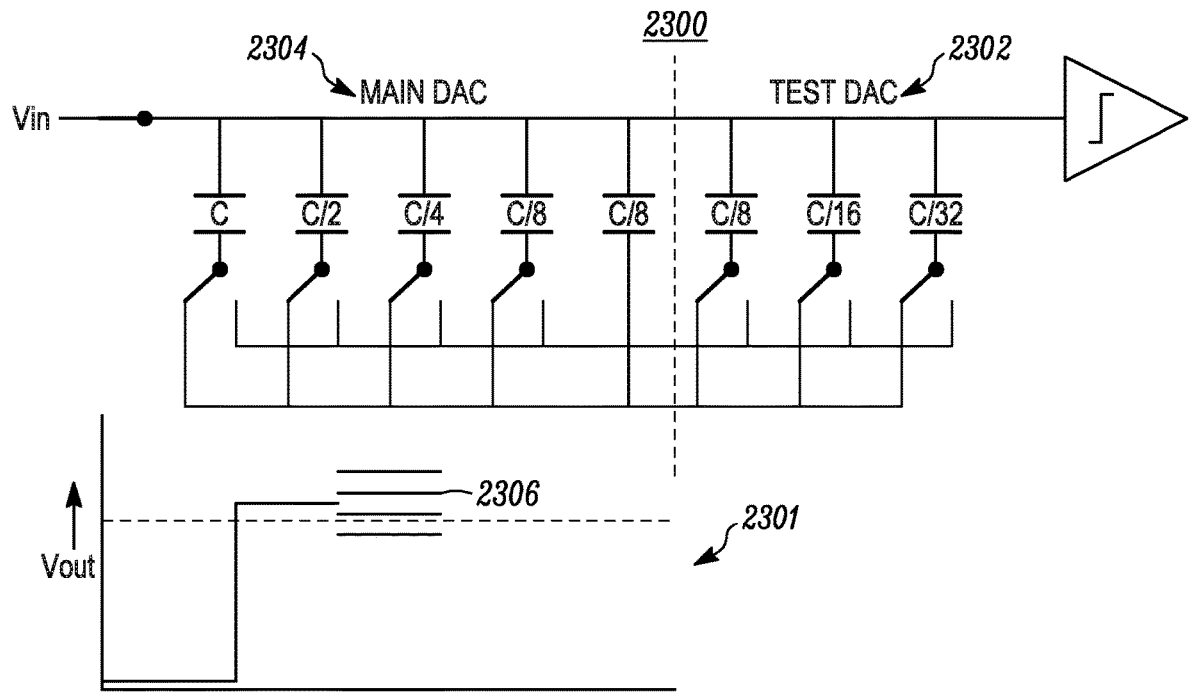
FIG. 23 is a schematic of another example of a differential CR-SAR ADC with additional test capabilities and a corresponding output voltage vs. time graph, in accordance with the invention.

FIG. 23 is a schematic of another example of a differential CR-SAR ADC 2300 with additional test capabilities in accordance with the invention, and a corresponding graph 2301 of output voltage versus time graph. The differential CR-SAR ADC 2300 includes a test DAC 2302 and main DAC 2304. Because embodiments of the invention can create arbitrary analog signals, these signals may be injected so that the CR-SAR ADC may be tested to verify that the output is as expected. However, this injection presents an issue. Because the signals are generated with capacitors, and then the same capacitors are used in the conversion again, if there is a production-introduced deviation and/or error in a capacitor, the DAC will generate a wrong signal, and, after conversion, it will appear as if the signal is correct. In order to overcome this problem, the test DAC 2302 is added to increase the self-testing accuracy to the main DAC 2304, as shown in FIG. 23. Because the test DAC 2302 is small, its absolute accuracy is good. A self-test does not require the test DAC 2304. However, accuracy of the self-test can be increased by (a) adding the small test DAC 2302, (b) splitting the LSB 2401 (see FIG. 24) into multiple smaller capacitive units whose sum is the capacitance of the LSB or (c) splitting the LSB into multiple smaller capacitive units whose sum is the capacitance of the LSB 2401 with a sub-radix(2) design.

A known value, such as, for example, 0V, is sampled with the DAC 2304 in a specific state. Although a value of the output after the main DAC 2304 switches back to the reset state cannot be certain because the capacitors might be inaccurate, the test DAC 2302 is much more accurate. Therefore, using the test DAC 2302, small addition offsets 2306 are generated and then the normal conversion is performed again. In this case, although an absolute value that should be generated by the DAC 2300 is unknown, a size that the steps should be is known from the test DAC 2302, which is sufficient to test and/or calibrate a complete ADC.

Example capacitor weights for a sub-radix(2) ADC are not 1, ½, ¼, etc., but instead are 8, 4, 2 and 1. These capacitor weights 8, 4, 2 and 1 provide a same functionality and make calculations easier. A sub-radix(2) ADC does not use power of 2s (16-8-4-2-1) as weights, but something smaller than that (16-9-5-3-2-1, for example). This means the same result can be achieved with different combinations.

Assuming the weights are 30-16-9-5-3-2-1, a step with weight '16' can be generated by inverting that one from its reset state. That same one may be generated by selecting '9', '5' and '2'. If a known state is sampled (e.g., 0V), and conversion is performed after using as reset states '1100000' and '1011010', the same result should be obtained after the conversion, because 9+5+2=16. If the same result is not obtained, an error must have occurred in the manufacturing process.

Figure 24:
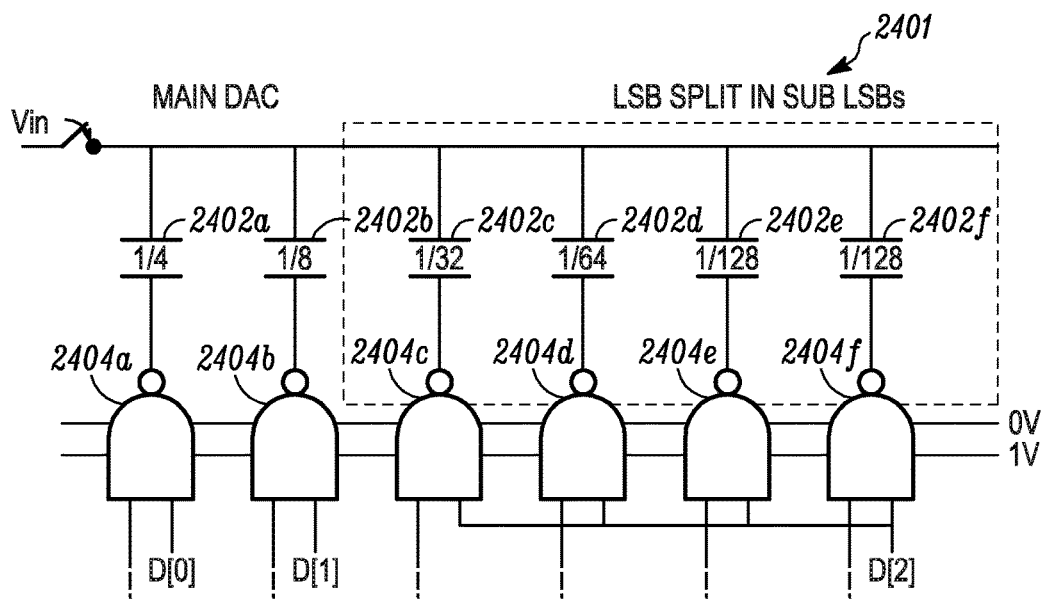
FIG. 24 is a schematic of another example of a differential CR-SAR ADC having improved accuracy, in accordance with the invention.

FIG. 24 is a schematic of an example of a differential CR-SAR DAC 2400 having an improvement in accuracy without a significant increase in power consumption in accordance with the invention. The improvement in accuracy is achieved by taking advantage of the addition of digital MUXes 2404a-2404f on the DAC input lines. In the differential CR-SAR DAC 2400, the LSB 2401 is split into four smaller bits which are equal to the LSB when switched together, and four corresponding additional capacitors 2402d-2402f are added. In this example, the total capacitance seen for the LSB 2401 has a value of $\frac{1}{16}$ C, so the values of the additional capacitors 2402d-2402f must add up to $\frac{1}{16}$ C (i.e., $\frac{1}{32}$C+$\frac{1}{64}$ C+$\frac{1}{128}$ C+$\frac{1}{128}$ C=$\frac{1}{16}$ C). One input of digital MUX 2404a, one input of digital MUX 2404d, one input of digital MUX 2404c, one input of digital MUX 2404e and one input of digital MUX 2404f are tied together. When the DAC 2400 is operating in a normal mode, without improved accuracy functionality, the common input to the LSB 2401 is a single value, D[2]. In the normal conversion mode, the other input to each MUX 2404c-2404f sets the mode and the conversion phase lasts for three clock cycles. When the DAC 2400 is in sampling mode, a preset value can now be made with higher accuracy with regards to the normal implementation.

Figure 25:
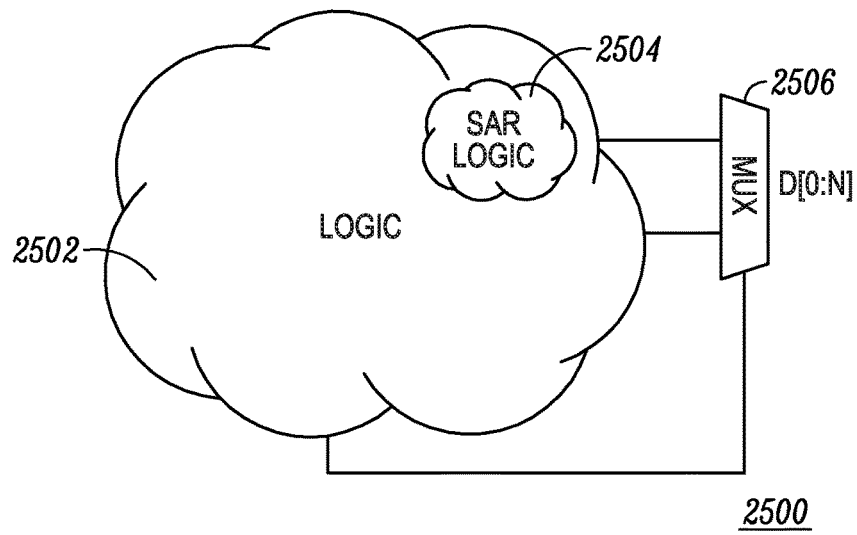
FIG. 25 is a simplified block diagram illustrating logic needed to drive the example CR-SAR ADC of FIG. 16, in accordance with the invention.

FIG. 25 illustrates a block diagram 2500 illustrating logic needed to drive the example CR-SAR ADCs in accordance with the invention. A logic block 2502 used to control multiplexers 2506 to set the mode operation of the CR-SAR ADC is separate from a primary SAR logic 2504 normally used to control an ADC. As such, embodiments of the CR-SAR ADC in accordance with the invention are capable of operating either as typical ADCs or as the improved ADCs discussed herein. The use of multiplexers as DAC drivers allows for re-use of existing hardware with no changes thereto other than the addition of external logic/ software, represented in FIG. 25 as logic block 2502, to make use of the different modes of operation in accordance with the invention.

Figure 26:
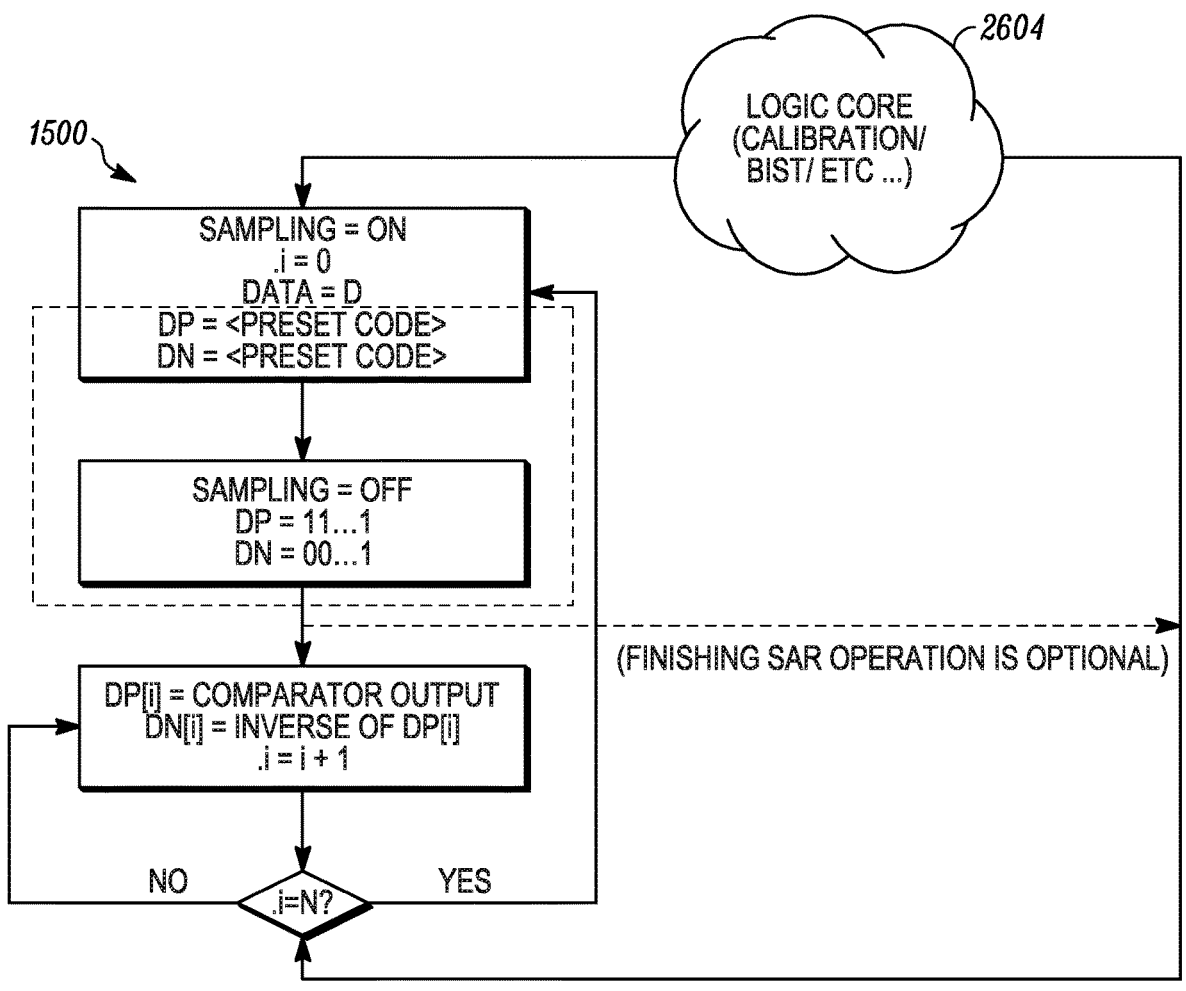
FIG. 26 is a simplified block diagram illustrating external logic needed to drive the example CR-SAR ADC of FIG. 16, in accordance with the invention.

FIG. 26 illustrates a block diagram 2600 having external logic 2604 to control the operation of state machine 1500 and to drive the CR-SAR ADC in accordance with the invention. The external logic 2604 may set the preset DAC input values to control the Vref value, to control the SAR, and to determine a mode of operation (e.g., calibration, self-test, and normal), etc., outside of the structure of the actual CR-SAR ADC state machine.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

The terms "a" or "an", as used herein, are defined as one as or more than one. The term plurality, as used herein, is defined as two as or more than two. Plural and singular terms are the same unless expressly stated otherwise. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The terms "program" and "software application" are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system."

The invention may be a system, a method, and/or a computer program product. The computer program product may include a computer readable storage medium (or media) having computer readable program instructions thereon for causing a processor to carry out aspects of the invention.

In one embodiment, a computer program product for operating a charge redistribution successive approximate register (CR-SAR) analog-to-digital converter (ADC), the CR-SAR ADC comprising a sample-and-hold switch, a digital-to-analog converter (DAC) having a plurality of control lines, a comparator, and a logic circuit is disclosed. The computer program product includes a non-transitory storage medium readable by a processing circuit and storing instructions for execution by the processing circuit for performing a method. The method includes the steps of presetting control lines of the DAC to non-default reset values; subsequent to presetting the control lines, closing the sample-and-hold switch to obtain a sample input voltage (Vin) value in a sampling phase; opening the sample-and-hold switch to enter a superposition phase; superpositioning an analog offset voltage onto Vin; resetting the control lines to default reset values; entering a conversion phase; and determining values of each successive bit in a digital output register during consecutive clock cycles.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely or partly on a user's computer or entirely or partly on a remote computer or server. In the latter scenario, the remote computer maybe connected to the user's computer through any type of network, including a local area network (LAN) or a wide area network (WAN), or the connection may be made to an external computer (for example, through the Internet). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the invention.

Aspects of the invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer, create means for implementing the functions/acts specified in the flowchart and/or block diagram blocks. These computer readable program instructions may also be stored in a computer readable storage medium that can direct a computer to function in a particular manner, such that the computer readable storage medium having instructions stored therein comprises an article of manufacture including instructions which implement aspects of the function/act specified in the flowchart and/or block diagram block or blocks.

The description of the present disclosure has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the invention.

What is claimed is:

1. A circuit comprising:
   a sample-and-hold switch for obtaining a sample input voltage (Vin) value;
   a digital-to-analog converter (DAC) comprising a plurality of digital multiplexers and a plurality of control lines, each digital multiplexer selecting between a superposition phase and a conversion phase and presenting input values to each control line of the plurality of control lines, the superposition phase superimposing an analog DC voltage onto Vin, the conversion phase determining values for a digital output register;
   a comparator having two inputs electrically coupled to the sample-and-hold switch and to the DAC such that an output of the DAC converter determines a value of each successive bit in the digital output register during consecutive clock cycles; and
   a logic circuit coupled to the output of the comparator and to the plurality of digital multiplexers of the DAC, the logic circuit comprising the digital output register which determines the input values to each control line of the plurality of control lines.

2. The circuit of claim 1, wherein the circuit is a charge redistribution successive approximate register (CR-SAR) analog-to-digital converter (ADC).

3. The circuit of claim 1, wherein the DAC further comprises a plurality of capacitors, each capacitor having a top plate and a bottom plate and each capacitor having a capacitance value greater than or equal to a capacitance value of a subsequent capacitor of the plurality of capacitors, wherein the top plate of each capacitor is electrically coupled to Vin and the bottom plate of each capacitor is electrically coupled to a digital multiplexer.

4. The circuit of claim 3, wherein a least significant bit of the digital output register corresponds to a control line coupled to a capacitor having a least capacitance value of the plurality of capacitors.

5. The circuit of claim 4, wherein the capacitor having a least capacitance value is a split-capacitor having a total capacitance value equal to the least capacitance value and each capacitor of the split-capacitor is coupled to an additional digital multiplexer allowing for the split-capacitor to be used as a split-capacitor in a first mode and a single capacitor in a second mode.

6. The circuit of claim 5, wherein each additional multiplexer has one input common to all capacitors in the split-capacitor and one input coupled to one control line corresponding to an additional bit in the digital output register.

7. The circuit of claim 1, wherein the control lines are preset to a non-default reset value prior to a sampling phase.

8. The circuit of claim 7, wherein the superposition phase occurs between the sampling phase and the conversion phase.

9. The circuit of claim 7, wherein the non-default reset value offsets manufacturing errors.

10. The circuit of claim 7, wherein the control lines are reset to a default reset value at a beginning of the conversion phase.

11. The circuit of claim 1, wherein each digital multiplexer is a logic gate.

12. A method of operating a charge redistribution successive approximate register (CR-SAR) analog-to-digital converter (ADC), the CR-SAR ADC comprising a sample-and-hold switch, a digital-to-analog converter (DAC) having a plurality of control lines, a comparator, and a logic circuit, the method comprising:
   presetting control lines of the DAC to non-default reset values;
   subsequent to presetting the control lines, closing the sample-and-hold switch to obtain a sample input voltage (Vin) value in a sampling phase;
   opening the sample-and-hold switch to enter a superposition phase;
   superpositioning an analog offset voltage onto Vin;
   resetting the control lines to default reset values;
   entering a conversion phase; and
   determining values of each successive bit in a digital output register during consecutive clock cycles.

13. The method of claim 12, wherein the DAC comprises a plurality of control lines and a plurality of digital multiplexers, each digital multiplexer selecting between the superposition phase and the conversion phase and presenting input values to each control line of the plurality of control lines.

14. The method of claim 12, wherein the DAC further comprises a plurality of capacitors, each capacitor having a top plate and a bottom plate and each capacitor having a capacitance value greater than or equal to a capacitance value of a subsequent capacitor of the plurality of capacitors, wherein the top plate of each capacitor is electrically coupled to Vin and the bottom plate of each capacitor is electrically coupled to a digital multiplexer.

15. The method of claim 14, wherein a most significant bit of the digital output register corresponds to a control line coupled to a capacitor having a greatest capacitance value of the plurality of capacitors.

16. The method of claim 14, wherein a least significant bit of the digital output register corresponds to a control line coupled to a capacitor having a least capacitance value of the plurality of capacitors.

17. The method of claim 12, wherein the superposition phase occurs between the sampling phase and the conversion phase.

18. The method of claim 12, wherein the non-default reset values offset manufacturing errors.

19. The method of claim 12, wherein each digital multiplexer is a logic gate.

20. An integrated circuit, comprising:
   a circuit-supporting substrate; and
   a charge redistribution successive approximate register (CR-SAR) analog-to-digital converter (ADC) disposed on the circuit-supporting substrate, the CR-SAR ADC including:
   a sample-and-hold switch for obtaining a sample input voltage (Vin) value,
   a digital-to-analog converter (DAC) comprising a plurality of digital multiplexers and a plurality of control lines, each digital multiplexer selecting between a superposition phase and a conversion phase and presenting input values to each control line of the plurality of control lines, the superposition phase superimposing an analog DC voltage onto Vin, the conversion phase determining values for a digital output register,
   a comparator having two inputs electrically coupled to the sample-and-hold switch and to the DAC such that an output of the DAC converter determines a value of each successive bit in the digital output register during consecutive clock cycles, and
   a logic circuit coupled to the output of the comparator and to the plurality of digital multiplexers of the DAC, the logic circuit comprising the digital output register which determines the input values to each control line of the plurality of control lines.

* * * * *